(12) United States Patent
Wiesbauer et al.

(10) Patent No.: US 6,879,273 B2
(45) Date of Patent: Apr. 12, 2005

(54) OVERSAMPLING IN ANALOG/DIGITAL AND DIGITAL/ANALOG CONVERTERS

(75) Inventors: Andreas Wiesbauer, Pörtschach (AT); Martin Clara, Villach (AT); Thomas Pötscher, Villach (AT); Hubert Weinberger, Soboth (AT); Jörg Hauptmann, Wernberg (AT); Thomas Magesacher, Villach (AT)

(73) Assignee: Infineon Technologies AG, München (DE)

( * ) Notice: Subject to any disclaimer, the term of this patent is extended or adjusted under 35 U.S.C. 154(b) by 24 days.

(21) Appl. No.: 10/669,280

(22) Filed: Sep. 23, 2003

(65) Prior Publication Data

US 2004/0263369 A1 Dec. 30, 2004

Related U.S. Application Data

(63) Continuation of application No. PCT/EP01/03685, filed on Mar. 30, 2001.

(51) Int. Cl.[7] .......................... H03M 1/00; H03M 3/00
(52) U.S. Cl. ....................................... 341/110; 341/143
(58) Field of Search ........................ 341/76, 77, 110, 341/131, 143; 375/243, 254

(56) References Cited

U.S. PATENT DOCUMENTS

| | | | |
|---|---|---|---|
| 5,019,819 A | * | 5/1991 | Kimura ..................... 341/143 |
| 5,073,778 A | * | 12/1991 | Ueki et al. ................ 341/131 |
| 5,144,306 A | * | 9/1992 | Masuda ....................... 341/76 |
| 5,148,167 A | * | 9/1992 | Ribner ...................... 341/143 |
| 5,252,973 A | * | 10/1993 | Masuda ..................... 341/131 |
| 5,760,722 A | * | 6/1998 | Harris et al. ............... 341/143 |
| 6,031,475 A | * | 2/2000 | Combe et al. ............. 341/143 |

OTHER PUBLICATIONS

Norsworthy et al., "A Programmable Codec Signal Processor," Solid–State Circuits Conference, 1996, Digest of Technical Papers, 42$^{nd}$ ISSCC., 1996 IEEE International, Feb. 8, 1996.

* cited by examiner

*Primary Examiner*—Howard L. Williams
(74) *Attorney, Agent, or Firm*—Jenkins, Wilson & Taylor, P.A.

(57) ABSTRACT

The invention creates a method and a device for digitally transmitting analog signals, in which oversampling is performed in analog/digital and digital/analog converters. In this arrangement, a digital/analog conversion is performed which, in particular, is suitable for VDSL systems. A transmitted digital transmission signal (110) is supplied to a mixing unit (201) and in the mixing unit (201), a receive noise signal (211) applied to a receive noise source terminal (209) is superimposed on the digital transmission signal (110). An interpolation filter unit (203), in combination with a subsequent noise shaping device (205), provides an increase in the frequency bandwidth, resulting in suitable oversampling.

8 Claims, 2 Drawing Sheets

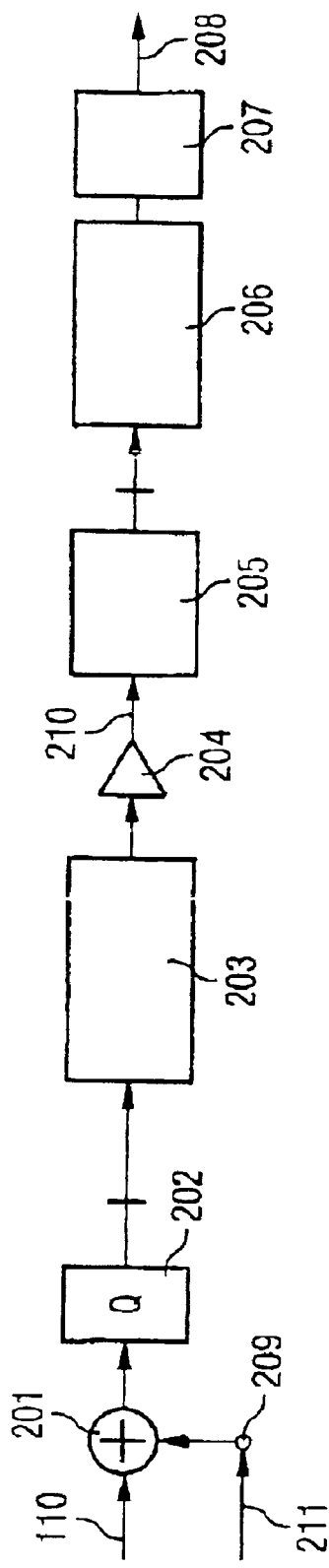
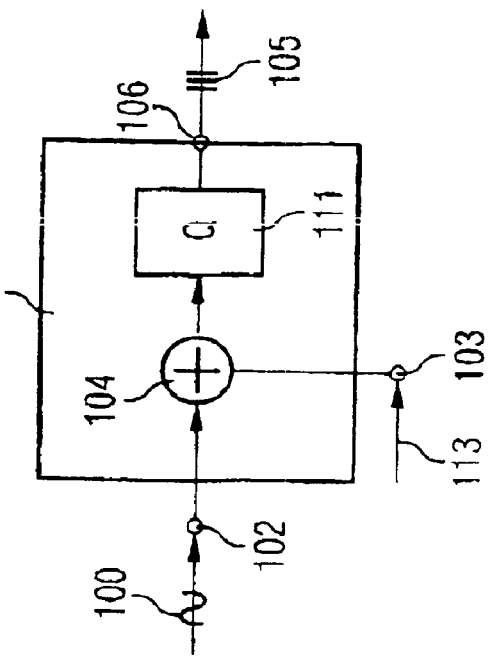

OVERSAMPLING IN ANALOG/DIGITAL AND DIGITAL/ANALOG CONVERTERS

RELATED APPLICATIONS

This application is a continuation of PCT patent application number PCT/EP01/03685, filed Mar. 30, 2001, the disclosure of which is incorporated herein by reference in its entirety.

TECHNICAL FIELD

The present invention relates to analog/digital and digital/analog converters and, in particular, relates to a method for oversampling in analog/digital and digital/analog converters which are used for data transmission by means of digital subscriber lines (DSL) and very high data rate digital subscriber lines (VDSL).

BACKGROUND ART

VDSL is the name for a transmission method, the transmission rate of which is higher than that of ADSL (Asymmetric Digital Subscriber Line). Conventionally, a VDSL system is used for a hybrid network which consists of optical fiber and copper lines, the use of optical fiber cables, in particular, providing high transmission rates.

In a hybrid network, an optical fiber cable is run up to the switching offices in the local area or even up to the cable distribution boxes on the side of the road, such conventional applications being known, for example, from the Internet address "http://www.e-online.de/sites/kom/0305237.htm.

An essential feature of digital transmission systems is an analog/digital conversion, digital transmission and subsequent digital/analog conversion of relevant data streams. In this arrangement, various methods of oversampling are conventionally used as described, for example, in the Internet reference "http://www.hoerwege.de/over+upsamp.htm.

To increase an effective bit number in conventional methods for digital data transmission, a method of noise shaping is conventionally used.

Conventional noise shaping which is used both for an A/D signal path and for a D/A signal path is described in the printed document "NORSWORTHY S R ET AL: "A programmable codec signal processor" SOLID-STATE CIRCUITS CONFERENCE, 1996. DIGEST OF TECHNICAL PAPERS. 42ND ISSCC., 1996 IEEE INTERNATIONAL SAN FRANCISCO, Calif., USA 8–10 FEB. 1996, NEW YORK, N.Y., USA, IEEE, US, 8 th Feb. 1996 (Feb. 2, 1998), pages 170–171, 438, XP010156441 ISBN: 0-7803-3136-2".

This printed document shows that second-order noise shaping can be performed but, disadvantageously, no separate noise shaping devices are specified which could provide adapted noise shaping. In the conventional method described, it is not possible, disadvantageously, to selectively provide an allocation of noises in individual frequency bands.

Furthermore, it is not suitable that the first noise shaping provided in a first noise shaping device cannot be combined with a second noise shaping provided in a second noise shaping device.

FIG. 3 shows a circuit arrangement of a conventional analog/digital converter as used, for example, in digital transmission systems. An analog input signal 100 is supplied to an input terminal 102. The analog/digital converter 101 contains a summing device 104 and a quantizing device 111 and a digital signal 105 can be picked up as output signal at an output terminal 106, and a noise signal 113 can be connected to a second input terminal, a noise source terminal 103.

The analog input signal 100 and a noise signal 113 connected to the noise source terminal 103 are superimposed in the summing device 104, the summed signal being supplied to the quantizing device 111. The output of the quantizing device 111 is connected to the output terminal 106, a digital signal 105 being provided as the output signal.

Such analog/digital converters according to the prior art have a number of disadvantages. In VDSL systems, analog/digital converters and digital/analog converters with an effective resolution of 9 bits to 12 bits are used. The resolution of these converters influences costs and chip area and energy consumption to a high degree in a design of an integrated circuit. On the other hand, converters with a high resolution allow the complexity of external components such as duplex filters, which can be connected to the integrated circuit, to be reduced.

Thus, a balance must be struck between the costs of an integrated circuit (or of a chip area) and a complexity (thus also the costs) of external components in designing a circuit.

SUMMARY OF THE INVENTION

It is thus an object of the present invention to provide analog/digital converters and digital/analog converters with high resolution without increasing an energy consumption and a chip area.

This object is achieved by a method for the digital transmission of analog signals in which oversampling is performed, according to claim 1, and a device having the features of claim 12.

The method according to the invention for the digital transmission of analog signals in which oversampling is performed, according to claim 1, and the device having the features of claim 12, respectively, have the following advantages.

The method according to the invention is advantageously used together with a noise shaping concept in VDSL (Very High Data Rate DSL) systems which increases an effective bit number.

It is also advantageous that a chip area of a factor of about 2 is saved by increasing a revolution by 1 bit.

The core of the invention is a method for oversampling in analog/digital and digital/analog converters in which oversampling with a first noise shaping which is performed by means of a first noise shaping device during an analog/digital conversion, is combined with a second noise shaping which is performed by means of a second noise shaping device during a digital/analog conversion.

The subclaims contain advantageous developments and improvements of the respective subject matter of the invention.

According to yet another preferred development of the present invention, a second-order comb filter is used as the decimation filter unit.

According to yet another preferred development of the present invention, the first noise shaping device is a first-order noise shaping device.

According to yet another preferred development of the present invention, the second noise shaping device is a first-order noise shaping device.

According to yet another preferred development of the present invention, an interpolation filter unit is a second-order comb filter.

According to yet another preferred development of the present invention, a digital/analog converter is a 10-bit current drive converter.

According to yet another preferred development of the present invention, noise shaping is provided by an adaptive noise shaping device.

BRIEF DESCRIPTION OF THE DRAWINGS

Illustrative embodiments of the invention are shown in the drawings and explained in greater detail in the description following. In the drawings:

FIG. 2 shows a circuit arrangement for digital/analog conversion with a second noise shaping device according to an illustrative embodiment of the present invention; and FIG. 3 shows a conventional circuit arrangement for analog/digital conversion.

DETAILED DESCRIPTION OF THE INVENTION

Figure 1A:
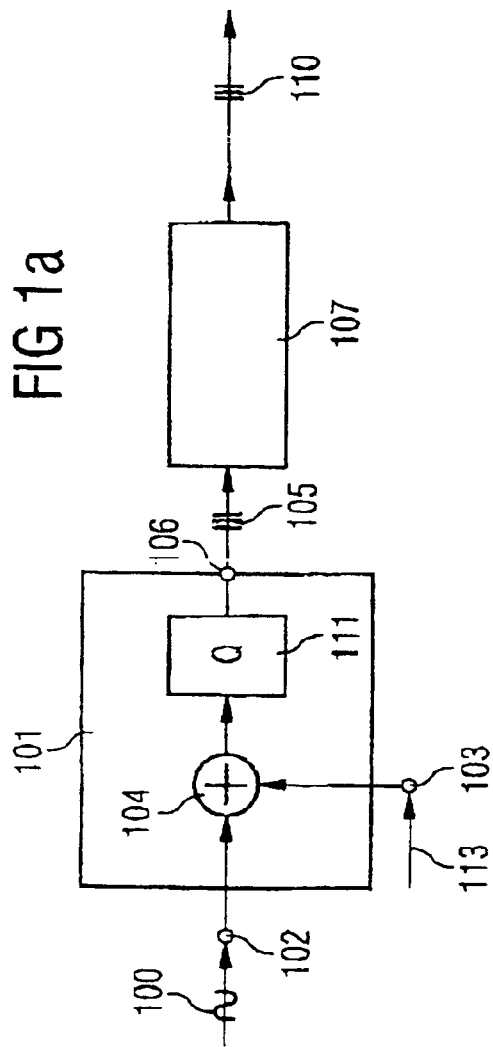
FIG. 1a shows a circuit arrangement for analog/digital conversion according to an illustrative embodiment of the present invention.

FIG. 1a shows a circuit arrangement for analog/digital conversion according to an illustrative embodiment of the present invention.

In the circuit arrangement shown in FIG. 1a, a conventional analog/digital converter 101 is used which is extended by a decimation filter unit 107. An output signal of the analog/digital converter 101 is provided as a digital signal 105 at an output terminal 106 and the decimation filter unit 107 is supplied with a digital signal 105 corresponding to an analog input signal 100.

The analog input signal 100 is converted into the digital signal 105 in a conventional manner in that the analog input signal 100 is supplied to an input terminal 102 of the analog/digital converter 101. Furthermore, a noise signal 113 is supplied to a noise source terminal 103, the analog input signal 100 and the noise signal 113 supplied to the noise source terminal 103 being superimposed in a summing device 104. The output signal of the summing device 104 is quantized in a quantizing device 111 in order to provide the output signal as a digital signal 105.

According to an illustrative embodiment of the present invention, a decimation filter unit 107, in which low-pass filtering is performed, is connected to the output. The decimation filter unit 107 is provided, for example, by a digital low-pass filter which reduces a frequency bandwidth of, for example, 260 MHz to a frequency bandwidth of 40 MHz, achieving an oversampling factor of approx. 6.6.

As shown in this illustrative embodiment, a resolution of the analog/digital converter is advantageously increased from 10 bits to 11 bits. As the output signal of the overall circuit arrangement shown in FIG. 1a, a digital transmission signal 110 is provided at the output of the decimation filter unit 107.

Figure 1B:
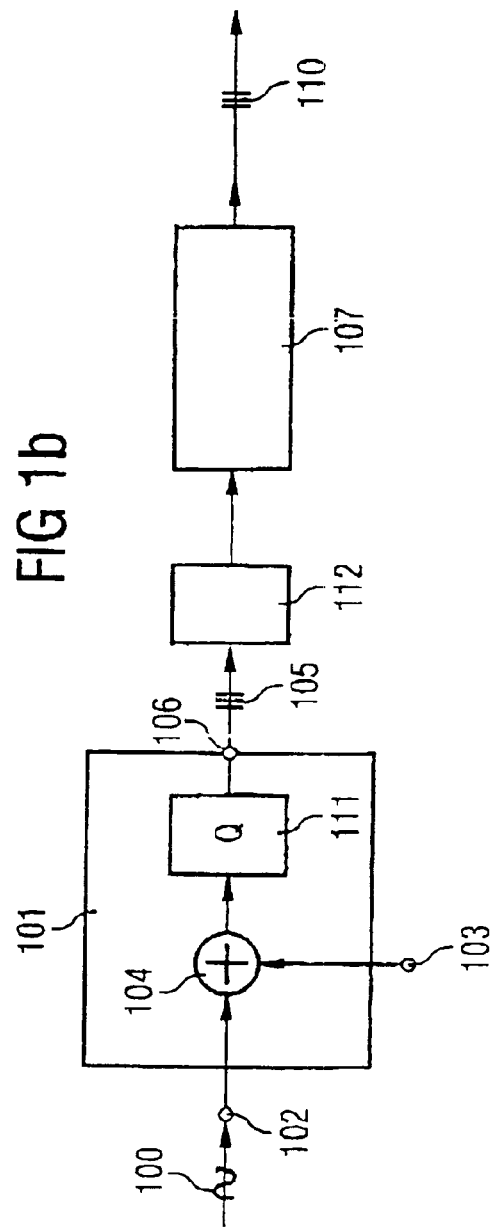
FIG. 1b shows a further circuit arrangement for analog/digital conversion according to a further illustrative embodiment of the present invention which, in comparison with the circuit arrangement shown in FIG. 1a, is extended by a first noise shaping device.

The circuit arrangement shown in FIG. 1b corresponds to the circuit arrangement shown in FIG. 1a, with the exception that a first nose shaping device 112 is arranged between the analog/digital converter 101 and the decimation filter unit 107.

Identical reference symbols as in FIG. 1a correspond to identical or similar components which are not explained again in order to avoid an overlapping description.

The first noise shaping device 112 is used for further increasing the resolution of the overall circuit arrangement. In the case of uniform quantization, identical noise energy (white noise) is in each case added to frequency sub-bands in the entire spectrum so that, during quantization, the least permissible distortion in the respective frequency band must always be used as a measure of the noise energy. In this arrangement, a maximum bit rate can disadvantageously not be utilized completely because specific frequency sub-bands permit less noise energy than the remaining frequency sub-bands.

Noise shaping performed in the first noise shaping device 112 enables an allocation of noise in individual frequency bands to be specified.

Combining the first noise shaping device 112 with the oversampling provided by the decimation filter unit 107 offers considerable advantages, particularly for VDSL systems providing, for example, a reduction in chip area needed, a reduction in energy consumption, improved resolution etc.

FIG. 2 illustrates a circuit arrangement for digital/analog conversion with a second noise shaping device 205 according to an illustrative embodiment of the present invention.

In the circuit arrangement shown in FIG. 2, digital/analog conversion is performed which, in particular, is suitable for VDSL systems. A transmitted digital transmission signal 110 is supplied to a mixing unit 201. In the mixing unit 201, a receive noise signal 211 applied to a receive noise source terminal 209 is superimposed on the digital transmission signal 110. The output signal of the mixing unit 201 is supplied to a post-quantizing device 202, an output signal quantized by the post-quantizing device 202 being supplied to an interpolation filter unit 203.

In the opposite way to the decimation filter unit 107 described with reference to FIGS. 1a, b, an interpolation filter unit 203 provides an increase in the frequency bandwidth by the same factor by which the frequency bandwidth was reduced in the example shown in FIGS. 1a, b, in this case by a factor which is approx. 6.6.

The output signal of the post-quantizing unit 202 is supplied to the interpolation filter unit 203 which provides suitable oversampling. An output signal of the interpolation filter unit 203 is supplied to an amplifier unit 204 in which the output signal of the interpolation filter unit 203 is amplified by a specifiable factor which, in particular, is suitable for driving the subsequent second noise shaping device 205.

An output signal of the amplifier unit 204 is supplied to the input of the second noise shaping device 205. In the second noise shaping device 205, noise shaping like that described with reference to the first noise shaping device 112 as in FIG. 1b is performed.

An output signal of the noise shaping device 205 is finally supplied to a digital/analog converter 206 which converts the digital output signal of the second noise shaping device 205 into an analog value.

The output signal of the digital/analog converter 206 is supplied to a post-filtering device 207 which filters out high frequency components which are caused by a stairstep-shaped variation of the analog output voltage due to the digital/analog conversion processes in the digital/analog converter 206. A filtered output signal of the post-filtering device 207 is provided as an analog output signal 208 for further processing.

The oversampling factor of 6.6, provided in this illustrative embodiment, and an interpolation filter unit 203 constructed as a second-order comb filter, a second first-order noise shaping device 205 and a digital/analog converter 206 which is constructed as a 10-bit current drive converter, result in an increase of a resolution by 2 bits, the circuit arrangement described with reference to FIGS. 1*a, b* providing a saving in chip area by approximately a factor of 2.

Although the present invention has been described above by means of preferred illustrated embodiments, it is not restricted to these but can be modified in many ways.

List of Reference Designations

In the figures, identical reference symbols designate identical or functionally identical components.

| | |
|---|---|
| 100 | Analog input signal |
| 101 | Analog/digital converter |
| 102 | Input terminal |
| 103 | Noise source terminal |
| 104 | Summing device |
| 105 | Digital signal |
| 106 | Output terminal |
| 107 | Decimation filter unit |
| 110 | Digital transmission signal |
| 111 | Quantization device |
| 112 | First noise shaping device |
| 113 | Noise signal |
| 201 | Mixing unit |
| 202 | Post-quantizing device |
| 203 | Interpolation filter unit |
| 204 | Amplifier unit |
| 205 | Second noise shaping device |
| 206 | Digital/analog converter |
| 207 | Post-filtering device |
| 208 | Analog output signal |
| 209 | Receive noise source terminal |
| 210 | Amplifier output signal |
| 211 | Receive noise signal |

What is claimed is:

1. Method for digitally transmitting analog signals, in which oversampling is performed, comprising the following steps:
   a) inputting an analog input signal into an analog/digital converter;
   b) mixing of the analog input signal mixed with signal in a summing device;
   c) quantizing the analog input signal mixed with the noise signal in a quantizing device, which provides a digital signal;
   d) filtering the digital signal obtained in a decimation filter unit, which provides a digital transmission signal with a reduced bandwidth;
   e) transmitting the digital transmission signal with the reduced bandwidth;
   f) supplying the transmitted digital transmission signal to a mixing unit;
   g) mixing the digital transmission signal with a receive noise signal in the mixing unit;
   h) post-quantizing the digital transmission signal mixed with the receive noise signal in a post-quantizing unit which provides a post-quantized signal;
   i) interpolating the post-quantized signal in an interpolation filter unit which provides an interpolated signal;
   j) amplifying the interpolated signal in an amplifier unit which provides an amplifier output signal;
   k) adapting the amplifier output signal in a second noise shaping device;
   l) post-filtering the amplifier output signal adapted by the second noise shaping device in a post-filtering device; and
   m) outputting an analog output signal out of the post-filtering device, wherein the method comprises the further step:
   n) performing a first noise shaping by means of a first noise shaping device, arranged between the analog/digital converter and the decimation filter, which is combined with a second noise shaping performed in the second noise shaping device, the first noise shaping performed in the first noise shaping device providing an allocation of noises in individual frequency bands.

2. Method for digitally transmitting analog signals according to claim 1, wherein a second-order comb filter is provided as decimation filter unit.

3. Method for digitally transmitting analog signals according to claim 1, wherein a first-order noise shaping device is provided as the first noise shaping device.

4. Method for digitally transmitting analog signals according to claim 1, wherein a first-order noise shaping device is provided as the second noise shaping device.

5. Method for digitally transmitting analog signals according to claim 1, wherein a second-order comb filter is provided as an interpolation filter unit.

6. Method for digitally transmitting analog signals according to claim 1, wherein a 10-bit current drive converter is provided as a digital/analog converter.

7. Method for digitally transmitting analog signals according to claim 1, wherein noise shaping is provided by an adaptive noise shaping device.

8. Device for digitally transmitting analog signals, comprising:
   a) an analog/digital converter for inputting an analog input signal;
   b) a summing device for mixing the analog input signal with a noise signal;
   c) a quantizing device for quantizing the analog input signal mixed with the noise signal;
   d) a decimation filter unit for filtering the digital signal obtained;
   e) a mixing unit for inputting the transmitted digital transmission signal;
   f) a post-quantizing unit for post quantizing the digital transmission signal mixed with the received noise signal;
   g) an interpolation filter unit for interpolating the post-quantized signal;
   h) an amplifier unit for amplifying the interpolated signal;
   i) a second noise shaping device which is arranged in front of an digital/analog converter, for adapting the amplifier output signal; and
   j) a post-filtering device for post-filtering the amplifier output signal adapted by the second noise shaping device, wherein the device also comprises the following:
   k) a first noise shaping device which is arranged between the analog/digital converter and the decimation filter, for performing first noise shaping which is combined with a second noise shaping performed in the second noise shaping device, the first noise shaping performed in the first noise shaping device providing an allocation of noises in individual frequency bands.

* * * * *